United States Patent
Arima et al.

(10) Patent No.: US 11,908,955 B2
(45) Date of Patent: Feb. 20, 2024

(54) SCHOTTKY BARRIER DIODE

(71) Applicant: TDK Corporation, Tokyo (JP)

(72) Inventors: Jun Arima, Tokyo (JP); Minoru Fujita, Tokyo (JP); Jun Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/802,438

(22) PCT Filed: Feb. 4, 2021

(86) PCT No.: PCT/JP2021/004060
§ 371 (c)(1),
(2) Date: Aug. 25, 2022

(87) PCT Pub. No.: WO2021/186936
PCT Pub. Date: Sep. 23, 2021

(65) Prior Publication Data
US 2023/0113129 A1    Apr. 13, 2023

(30) Foreign Application Priority Data
Mar. 19, 2020  (JP) .................................. 2020-049789

(51) Int. Cl.
*H01L 29/872* (2006.01)
*H01L 29/06* (2006.01)
(Continued)

(52) U.S. Cl.
CPC ........ *H01L 29/872* (2013.01); *H01L 29/0611* (2013.01); *H01L 29/167* (2013.01); *H01L 29/40* (2013.01)

(58) Field of Classification Search
CPC ... H01L 29/0611; H01L 29/167; H01L 29/40; H01L 29/0661; H01L 29/24;
(Continued)

(56) References Cited

U.S. PATENT DOCUMENTS

2015/0333190 A1* 11/2015 Aketa .................. H01L 29/408
257/77
2016/0254357 A1* 9/2016 Aketa .................. H01L 29/167
257/77
(Continued)

FOREIGN PATENT DOCUMENTS

EP      0 044 048 A    1/1982
JP      57-048240 A    3/1982
(Continued)

OTHER PUBLICATIONS

International Search Report issued in corresponding International Patent Application No. PCT/JP2021/004060, dated Mar. 30, 2021, with English translation.

*Primary Examiner* — Shahed Ahmed
(74) *Attorney, Agent, or Firm* — Rimon P.C.; Tomoki Tanida

(57) ABSTRACT

A Schottky barrier diode 1 includes: a semiconductor substrate made of gallium oxide; a drift layer made of gallium oxide; an anode electrode brought into Schottky contact with an upper surface of the drift layer; and a cathode electrode brought into ohmic contact with a lower surface of the semiconductor substrate. A ring-shaped outer peripheral trench is formed in the upper surface of the drift layer, and the anode electrode is partly filled in the outer peripheral trench. A ring-shaped back surface trench is formed in the lower surface of the semiconductor substrate such that the bottom thereof reaches the drift layer. This limits a current path to the area surrounded by the back surface trench, thereby mitigating electric field concentration in the vicinity of the bottom of the outer peripheral trench.

6 Claims, 9 Drawing Sheets

(51) Int. Cl.
*H01L 29/167* (2006.01)
*H01L 29/40* (2006.01)

(58) Field of Classification Search
CPC ......... H01L 29/872–8725; H01L 2924/12032; H01L 29/66143; H01L 27/0766; H01L 21/823481; H01L 21/823878; H01L 21/76224–76237; H10K 51/0579
See application file for complete search history.

(56) References Cited

U.S. PATENT DOCUMENTS

2019/0148563 A1     5/2019  Sasaki et al.
2019/0273139 A1*    9/2019  Horikiri ............ H01L 21/02491
2020/0006327 A1     1/2020  Aketa et al.

FOREIGN PATENT DOCUMENTS

| JP | 2000-294740 A | 10/2000 |
| JP | 2017-045969 A | 3/2017 |
| JP | 2017-199869 A | 11/2017 |
| WO | 2019/082580 A1 | 5/2019 |

* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2021/004060, filed on Feb. 4, 2021, which claims the benefit of Japanese Patent Application No. 2020-049789, filed on Mar. 19, 2020, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (about 8 MV/cm), so that a Schottky barrier diode using gallium oxide is very promising as the switching element for a power device. An example of the Schottky barrier diode using gallium oxide is described in Patent Documents 1 and 2.

CITATION LIST

[Patent Document]
[Patent Document 1] JP 2017-045969A
[Patent Document 2] JP 2017-199869A

SUMMARY OF THE INVENTION

Problem to be Solved by the Invention

However, in the Schottky barrier diodes described in Patent Documents 1 and 2, an electric field concentrates in the vicinity of the outer peripheral end of the anode electrode, which may cause dielectric breakdown at this portion.

It is therefore an object of the present invention to provide a Schottky barrier diode using gallium oxide, which is capable of preventing dielectric breakdown due to concentration of an electric field.

Means for Solving the Problem

A Schottky barrier diode according to the present invention includes: a semiconductor substrate made of gallium oxide; a drift layer made of gallium oxide, having a lower surface contacting the upper surface of the semiconductor substrate and an upper surface positioned on the side opposite the lower surface, and having a ring-shaped outer peripheral trench in the upper surface; an anode electrode brought into Schottky contact with the upper surface of the drift layer surrounded by the outer peripheral trench and filled inside the outer peripheral trench through an insulating film; and a cathode electrode brought into ohmic contact with the lower surface of the semiconductor substrate on the side opposite the upper surface thereof. A ring-shaped back surface trench is formed in the lower surface of the semiconductor substrate such that the bottom thereof reaches the drift layer. The cathode electrode is not present at a part of the lower surface of the semiconductor substrate that is outside the area surrounded by the back surface trench but is provided within the area surrounded by the back surface trench. A part of the drift layer that is surrounded by the outer peripheral trench overlaps the area surrounded by the back surface trench in a plan view.

According to the present invention, the ring-shaped back surface trench whose bottom reaches the drift layer is formed in the semiconductor substrate, so that a current path is limited to the area surrounded by the back surface trench. This mitigates electric field concentration in the vicinity of the bottom of the outer peripheral trench, thus making it possible to prevent dielectric breakdown.

In the present invention, the inner peripheral wall of the back surface trench may be positioned inside the outer peripheral wall of the outer peripheral trench in a plan view. This significantly mitigates electric field concentration in the vicinity of the outer edge of the outer peripheral trench, thus making it possible to prevent dielectric breakdown more effectively.

In the present invention, the inner peripheral wall of the back surface trench may be positioned between the inner and outer peripheral walls of the outer peripheral trench in a plan view. This can sufficiently ensure the sectional area of the drift layer functioning as a current path while preventing dielectric breakdown.

The Schottky barrier diode according to the present invention may further include a field insulating film that covers the upper surface of the drift layer in a ring shape so as to surround the outer peripheral trench, and the outer peripheral end of the anode electrode may be positioned on the field insulating film. This significantly mitigates electric field concentration in the vicinity of the outer peripheral end of the anode electrode, thus making it possible to prevent dielectric breakdown more effectively.

In the present invention, the back surface trench may be filled with an insulating material. This can increase mechanical strength of the entire structure.

In the present invention, a plurality of center trenches may be formed on the upper surface of the drift layer so as to be surrounded by the outer peripheral trench, and the anode electrode may be filled in the center trenches through an insulating film. With this configuration, when a backward voltage is applied between the anode electrode and the cathode electrode, a mesa region defined by the center trenches becomes a depletion layer, so that a channel region of the drift layer is pinched off. Thus, a leak current upon application of the backward voltage can be significantly reduced.

Advantageous Effects of the Invention

As described above, according to the present invention, it is possible to prevent dielectric breakdown caused due to concentration of an electric field in a Schottky barrier diode using gallium oxide.

MODE FOR CARRYING OUT THE INVENTION

Preferred embodiments of the present invention will be explained below in detail with reference to the accompanying drawings.

First Embodiment

Figure 1:
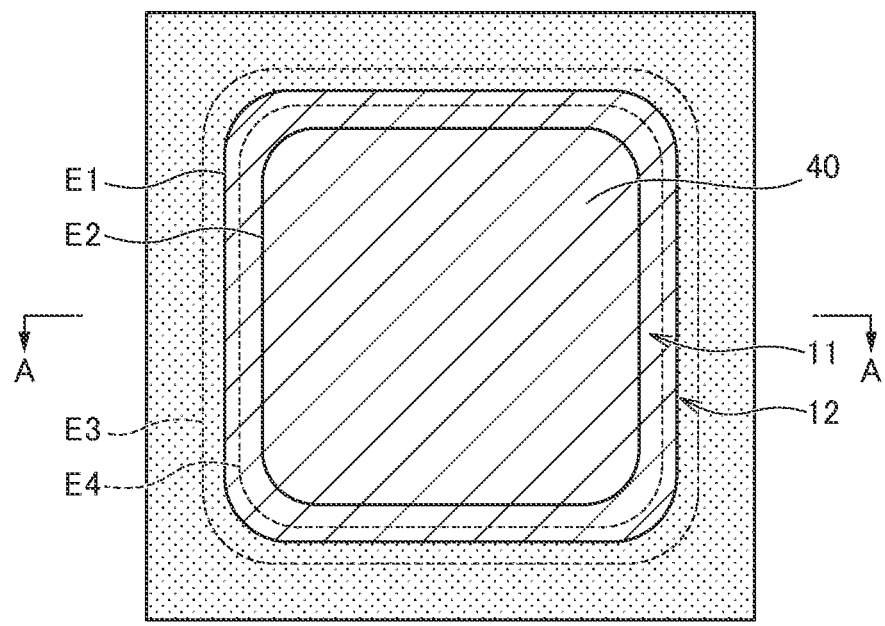
FIG. 1 is a schematic plan view illustrating the configuration of a Schottky barrier diode 1 according to a first embodiment of the present invention.
Figure 2:
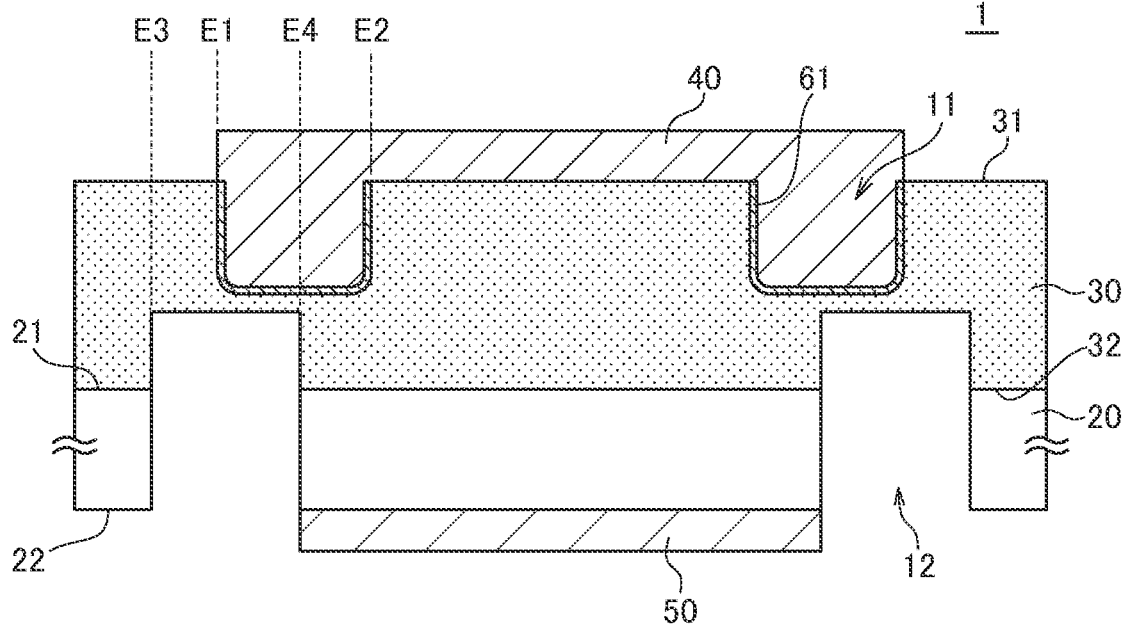
FIG. 2 is a schematic cross-sectional view taken along line A-A in FIG. 1.

FIG. 1 is a schematic plan view illustrating the configuration of a Schottky barrier diode 1 according to a first embodiment of the present invention. FIG. 2 is a schematic cross-sectional view taken along line A-A in FIG. 1.

As illustrated in FIGS. 1 and 2, the Schottky barrier diode 1 according to the present embodiment has a semiconductor substrate 20 and a drift layer 30, both of which are made of gallium oxide ($\beta$—$Ga_2O_3$). The semiconductor substrate 20 and the drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an $n^-$ layer, respectively.

The semiconductor substrate 20 is obtained by cutting a bulk crystal formed using a melt-growing method, and the thickness thereof is about 250 μm. Although there is no particular restriction on the planar size of the semiconductor substrate 20, the planar size is generally selected in accordance with the amount of current flowing in the element and, when the maximum amount of forward current is about 20A, the size may be set to about 2.4 mm×2.4 mm in a plan view.

The semiconductor substrate 20 has an upper surface 21 positioned on the upper surface side in a mounted state and a lower surface 22 positioned on the substrate side (opposite to the upper surface 21 side) in the mounted state. The drift layer 30 is formed on the upper surface 21 of the semiconductor substrate 20. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. The drift layer 30 has a lower surface 32 contacting the upper surface 21 of the semiconductor substrate 20 and an upper surface 31 positioned on the upper surface side (opposite to the lower surface 32 side) in the mounted state. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 μm.

An outer peripheral trench 11 having a ring shape is formed in the upper surface 31 of the drift layer 30. The inner wall of the outer peripheral trench 11 is covered with an insulating film 61 made of $HfO_2$. In addition to $HfO_2$, insulating materials such as $Al_2O_3$ may be used as the material of the insulating film 61.

An anode electrode 40, which is brought into Schottky contact with the drift layer 30, is formed in the upper surface 31 of the drift layer 30 within the area surrounded by the outer peripheral trench 11. The anode electrode 40 is also filled inside the outer peripheral trench 11 through the insulating film 61. The anode electrode 40 is formed of metal such as platinum (Pt), palladium (Pd), gold (Au), nickel (Ni), molybdenum (Mo), or copper (Cu). The anode electrode 40 may have a multilayer structure of different metal films, such as Pt/Au, Pt/Al, Pd/Au, Pd/Al, Pt/Ti/Au, or Pd/Ti/Au. The same or different metal material as that of the anode electrode 40 may be filled inside the outer peripheral trench 11.

A ring-shaped back surface trench 12 is formed in the lower surface 22 of the semiconductor substrate 20. The back surface trench 12 penetrates the semiconductor substrate 20, and the bottom thereof reaches the drift layer 30. A cathode electrode 50, which is brought into ohmic contact with the semiconductor substrate 20, is formed on the lower surface 22 of the semiconductor substrate 20 within the area surrounded by the back surface trench 12. The cathode electrode 50 is made of metal such as titanium (Ti). The cathode electrode 50 may have a multilayer structure of different metal films, such as Ti/Au or Ti/Al.

Assuming that the outer and inner peripheral walls of the outer peripheral trench 11 are referred to as E1 and E2, respectively and that the outer and inner peripheral walls of the back surface trench 12 are referred to as E3 and E4, respectively, the inner peripheral wall E2 is positioned inside the inner peripheral wall E4 in a plan view, the inner peripheral wall E4 is positioned inside the outer peripheral wall E1 in a plan view, and the outer peripheral wall E1 is positioned inside the outer peripheral wall E3 in a plan view. Accordingly, a part of the drift layer 30 that is surrounded by the outer peripheral trench 11 overlaps, in a plan view, a part of the drift layer 30 that is surrounded by the back surface trench 12.

The cathode electrode 50 is not provided at a part of the lower surface 22 of the semiconductor substrate that is outside the area surrounded by the back surface trench 12 but is selectively provided within the area surrounded by the back surface trench 12. Thus, when a backward voltage is applied between the anode electrode 40 and the cathode electrode 50, the flow of a backward current is limited to the area surrounded by the back surface trench 12. This mitigates electric field concentration in the vicinity of the outer edge of the outer peripheral trench 11 where an electric field is likely to concentrate. In particular, in the present embodiment, the inner peripheral wall E4 of the back surface trench 12 is positioned inside the outer peripheral wall E1 of the outer peripheral trench 11 in a plan view, so that electric field concentration in the vicinity of the outer edge of the outer peripheral trench 11 is significantly mitigated. In addition, the inner peripheral wall E4 of the back surface trench 12 is positioned between the inner and outer peripheral walls E2 and E1 of the outer peripheral trench 11 in a plan view, so that a part of the drift layer 30 that functions as a current path is not excessively narrowed but has a sufficient sectional area, thus making it possible to ensure a sufficient ON-current.

Figure 3:
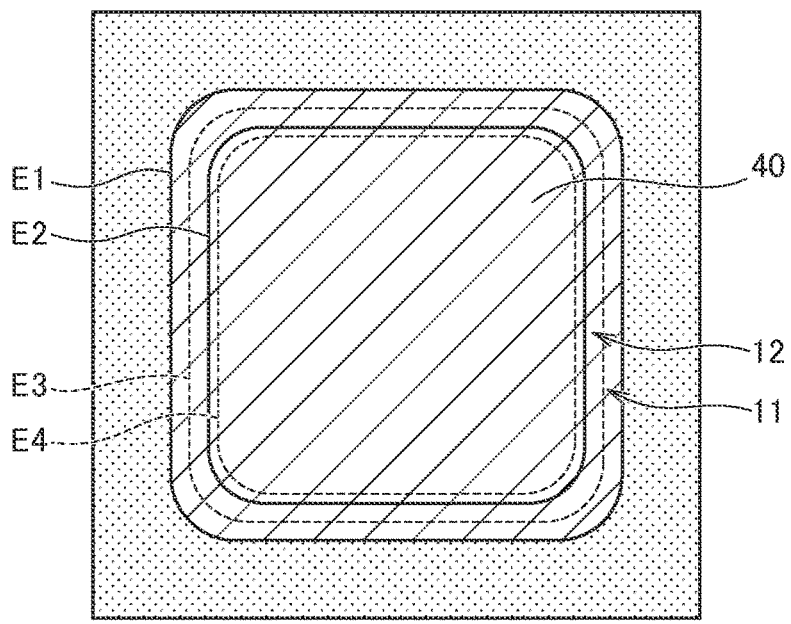
FIG. 3 is a schematic plan view illustrating the configuration of a Schottky barrier diode 1A according to a first modification of the first embodiment.
Figure 4:
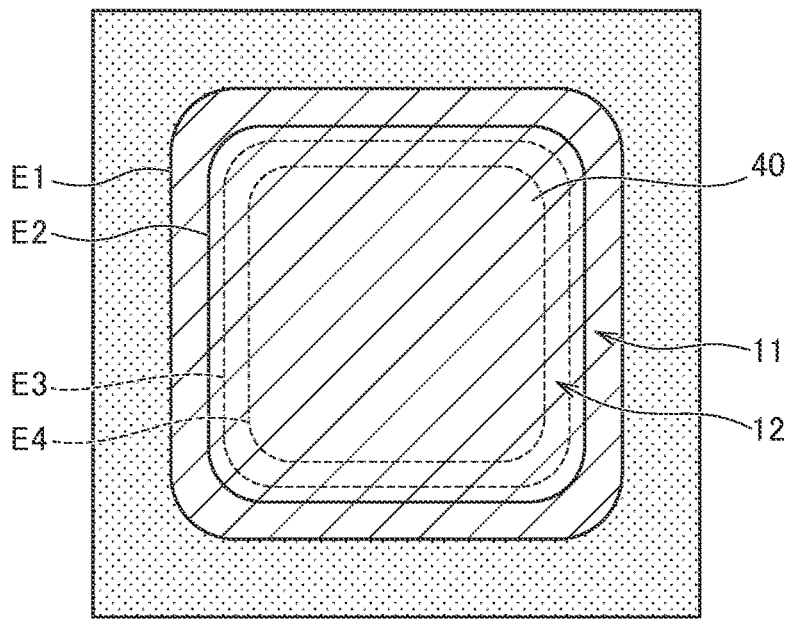
FIG. 4 is a schematic plan view illustrating the configuration of a Schottky barrier diode 1B according to a second modification of the first embodiment.
Figure 5:
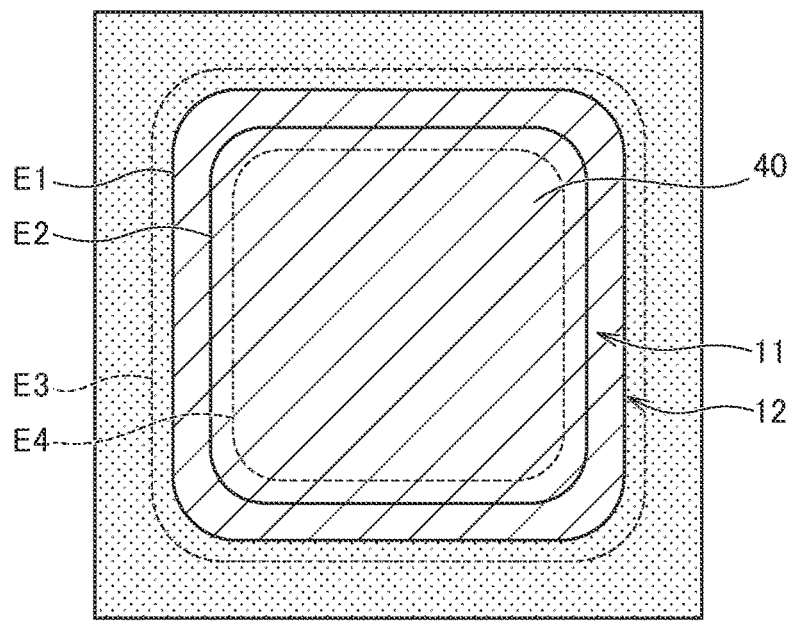
FIG. 5 is a schematic plan view illustrating the configuration of a Schottky barrier diode 1C according to a third modification of the first embodiment.
Figure 6:
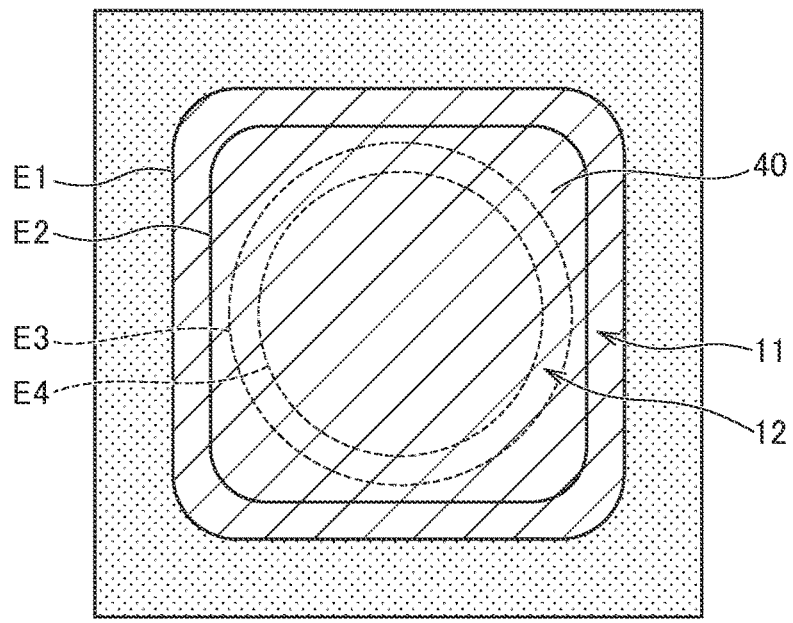
FIG. 6 is a schematic plan view illustrating the configuration of a Schottky barrier diode 1D according to a fourth modification of the first embodiment.

However, in the present invention, the positional relation between the outer peripheral trench 11 and the back surface trench 12 is not limited to this. For example, as in a Schottky barrier diode 1A according to a first modification illustrated in FIG. 3, the outer peripheral wall E3 of the back surface trench 12 may be positioned between the outer and inner peripheral walls E1 and E2 of the outer peripheral trench 11 in a plan view, and the inner peripheral wall E4 of the back surface trench 12 may be positioned inside the inner peripheral wall E2 of the outer peripheral trench 11 in a plan view. Further, as in a Schottky barrier diode 1B according to a second modification illustrated in FIG. 4, the outer peripheral wall E3 of the back surface trench 12 may be positioned inside the inner peripheral wall E2 of the outer peripheral trench 11 in a plan view. Further, as in a Schottky barrier diode 1C according to a third modification illustrated in FIG. 5, the outer and inner peripheral walls E1 and E2 of the outer peripheral trench 11 may be positioned between the outer and inner peripheral walls E3 and E4 of the back surface trench 12 in a plan view. Further, as in a Schottky barrier diode 1D according to a fourth modification illustrated in FIG. 6, the outer peripheral trench 11 and back surface trench 12 may have different planar shapes.

Figure 7:
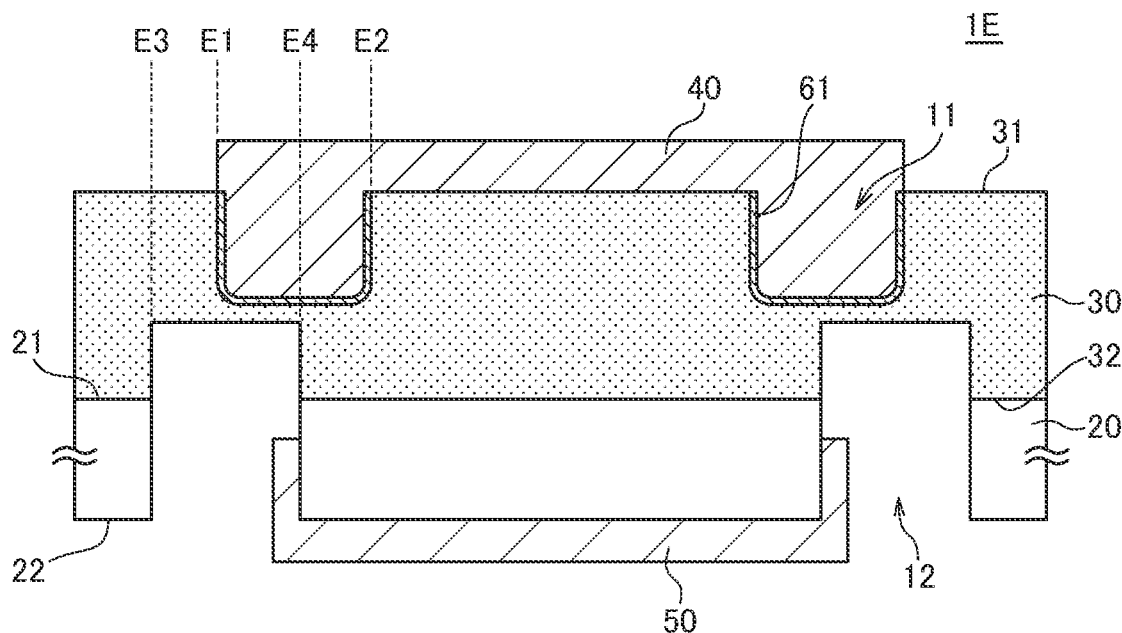
FIG. 7 is a schematic cross-sectional view illustrating the configuration of a Schottky barrier diode 1E according to a fifth modification of the first embodiment.
Figure 8:
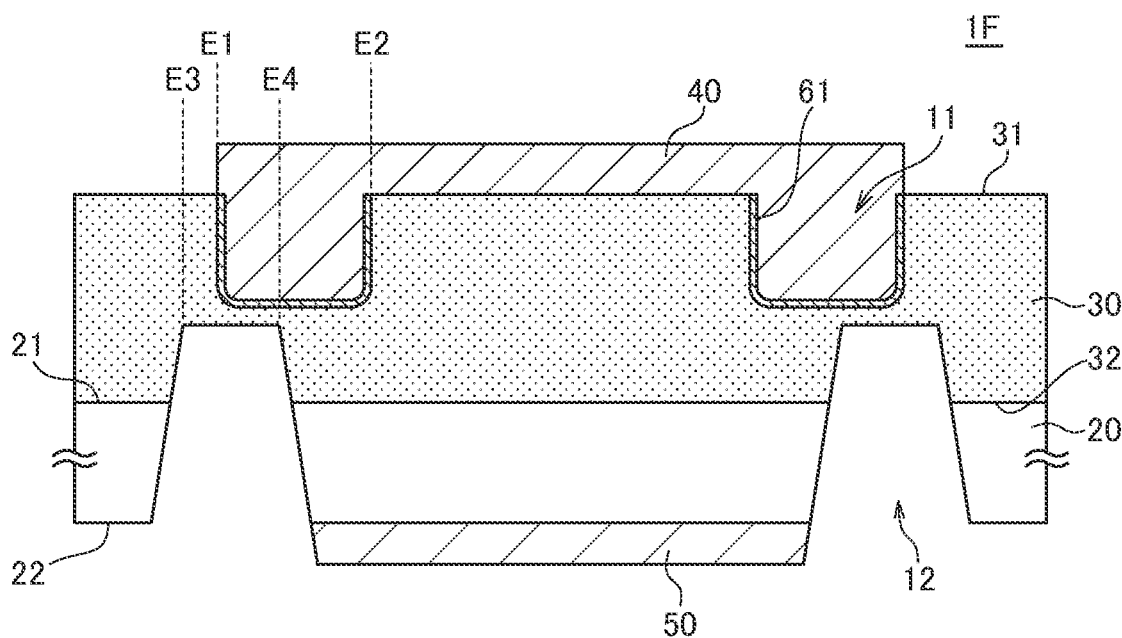
FIG. 8 is a schematic cross-sectional view illustrating the configuration of a Schottky barrier diode 1F according to a sixth modification of the first embodiment.

Further, as in a Schottky barrier diode 1E according to a fifth modification illustrated in FIG. 7, a part of the semiconductor substrate 20 that is exposed to the inner peripheral wall E4 of the back surface trench 12 may be covered with the cathode electrode 50. Further, as in a Schottky barrier diode 1F according to a sixth modification illustrated in FIG. 8, the back surface trench 12 may be formed into such a tapered shape that the trench width thereof is reduced in the depth direction. In this case, the outer and inner peripheral walls E3 and E4 of the back surface trench 12 may each be defined by the planar position of the trench bottom. The same is applied to the case where the outer peripheral trench 11 is formed into a tapered shape.

Figure 9:
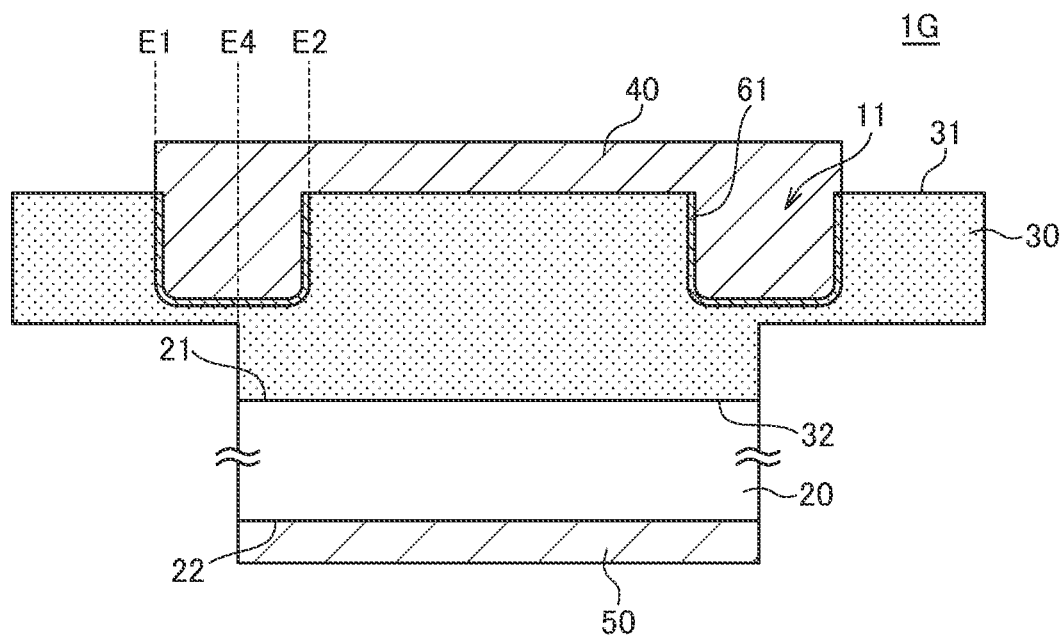
FIG. 9 is a schematic cross-sectional view illustrating the configuration of a Schottky barrier diode 1G according to a seventh modification of the first embodiment.

Further, as in a Schottky barrier diode 1G according to a seventh modification illustrated in FIG. 9, the semiconductor substrate 20 and drift layer 30 may each be removed at a part thereof positioned outside the outer peripheral end of the back surface trench 12. That is, the back surface trench 12 only needs to have the inner peripheral wall E4 and may not necessarily have the outer peripheral wall E3.

Second Embodiment

Figure 10:
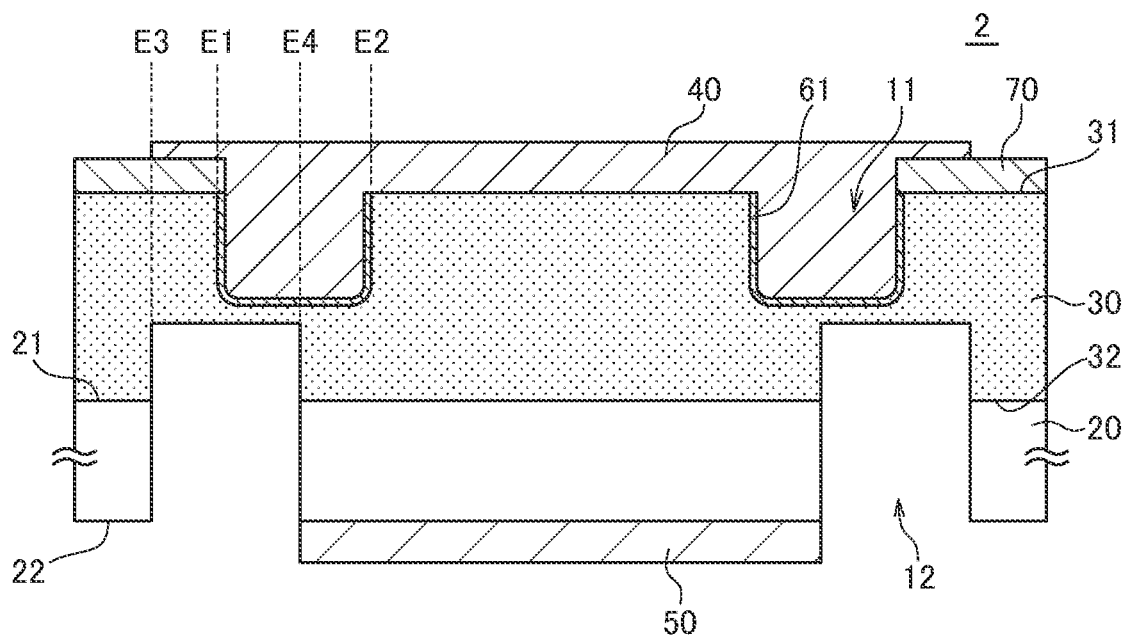
FIG. 10 is a schematic cross-sectional view illustrating the configuration of a Schottky barrier diode 2 according to a second embodiment of the present invention.

FIG. 10 is a schematic cross-sectional view illustrating the configuration of a Schottky barrier diode 2 according to a second embodiment of the present invention.

As illustrated in FIG. 10, the Schottky barrier diode 2 according to the second embodiment differs from the Schottky barrier diode 1 according to the first embodiment in that the anode electrode 40 is present outside the outer peripheral end of the outer peripheral trench 11 and that a ring-shaped field insulating film 70 is interposed between the anode electrode 40 and the upper surface 31 of the drift layer 30. Accordingly, the outer peripheral end of the anode electrode 40 is positioned on the field insulating film 70. Other basic configurations are the same as those of the Schottky barrier diode 1 according to the first embodiment, so the same reference numerals are given to the same elements, and overlapping description will be omitted.

According to the present embodiment, the field insulating film 70 is interposed between the anode electrode 40 positioned outside the outer peripheral end of the outer peripheral trench 11 and the drift layer 30, so that concentration of an electric field in the vicinity of the outer peripheral end of the anode electrode 40 can be mitigated. As the material of the field insulating film 70, $SiO_2$ or the like can be used.

Third Embodiment

Figure 11:
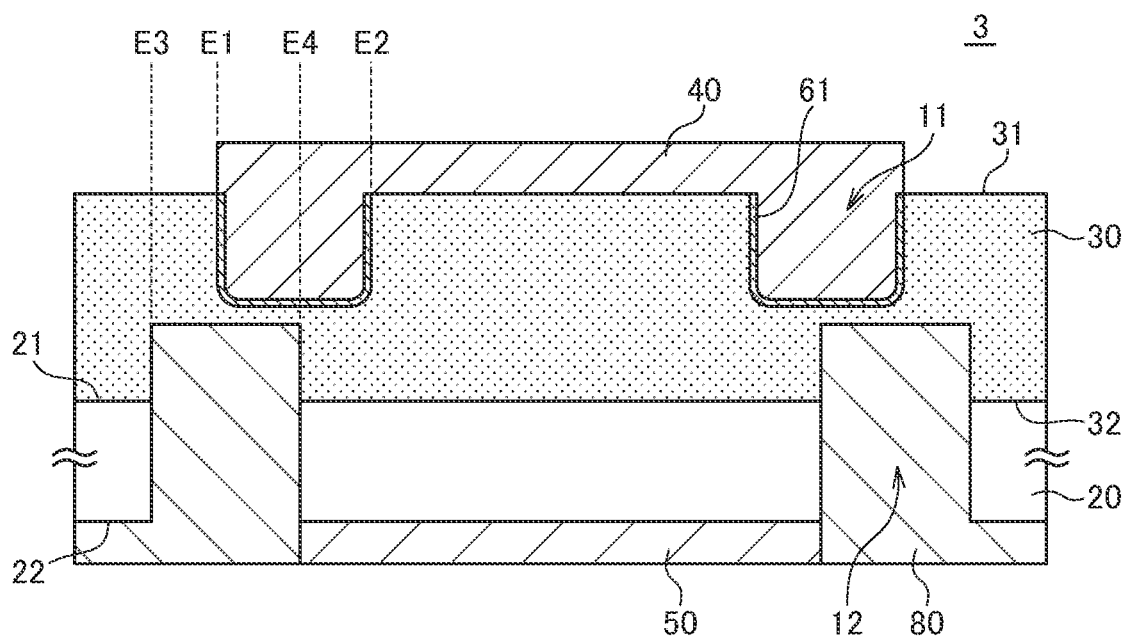
FIG. 11 is a schematic cross-sectional view illustrating the configuration of a Schottky barrier diode 3 according to a third embodiment of the present invention.

FIG. 11 is a schematic cross-sectional view illustrating the configuration of a Schottky barrier diode 3 according to a third embodiment of the present invention.

As illustrated in FIG. 11, the Schottky barrier diode 3 according to the third embodiment differs from the Schottky barrier diode 1 according to the first embodiment in that the back surface trench 12 is filled with an insulating material 80. The insulating material 80 is also present at a part of the lower surface 22 of the semiconductor substrate 20 outside the peripheral end of the back surface trench 12. Other basic configurations are the same as those of the Schottky barrier diode 1 according to the first embodiment, so the same reference numerals are given to the same elements, and overlapping description will be omitted.

According to the present embodiment, the back surface trench 12 is filled with the insulating material 80, so that mechanical strength of the entire structure increases. As the insulating material, $SiO_2$, $SiN$, $Al_2O_3$, AlN, BN, or the like can be used. Further, using a material having a high thermal conductivity as the insulating material 80 makes it possible to enhance heat dissipation. A material having a thermal conductivity higher than the thermal conductivity (0.1 W/cm·K to 0.3 W/cm·K) of gallium oxide can be taken as an example of such a material.

Figure 12:
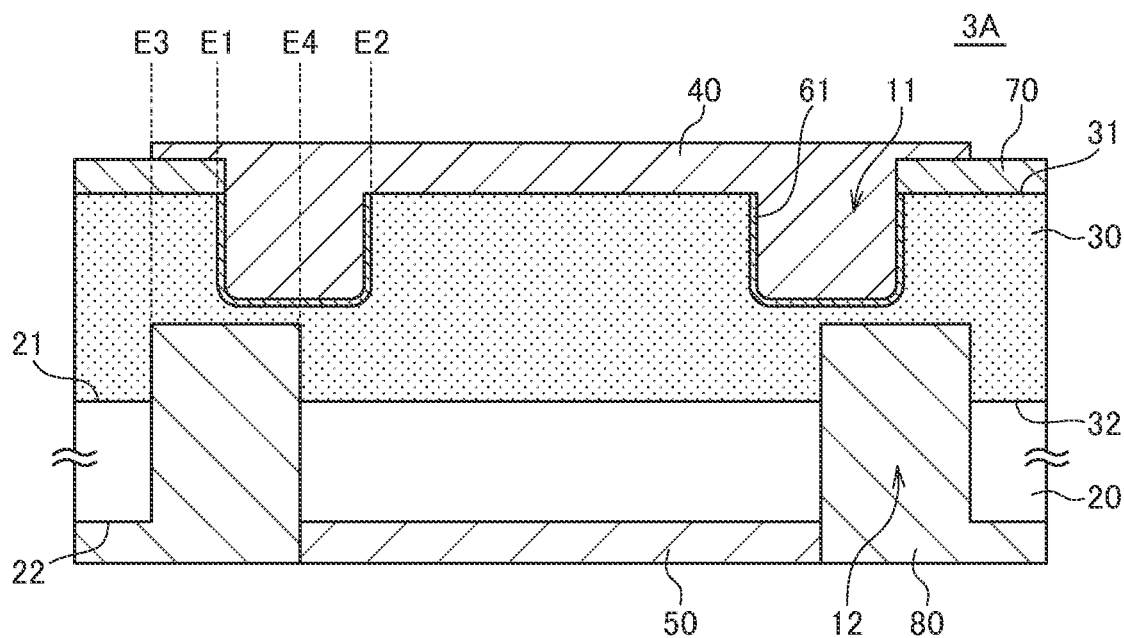
FIG. 12 is a schematic cross-sectional view illustrating the configuration of a Schottky barrier diode 3A according to a first modification of the third embodiment.

FIG. 12 is a schematic cross-sectional view illustrating the configuration of a Schottky barrier diode 3A according to a modification of the third embodiment. The Schottky barrier diode 3A according to the modification differs from the Schottky barrier diode 3 according to the third embodiment in that the field insulating film 70 is provided as in the Schottky barrier diode 2 according to the second embodiment. As exemplified by this modification, the field insulating film 70 may be provided in a configuration where the back surface trench 12 is filled with the insulating material 80.

Fourth Embodiment

Figure 13:
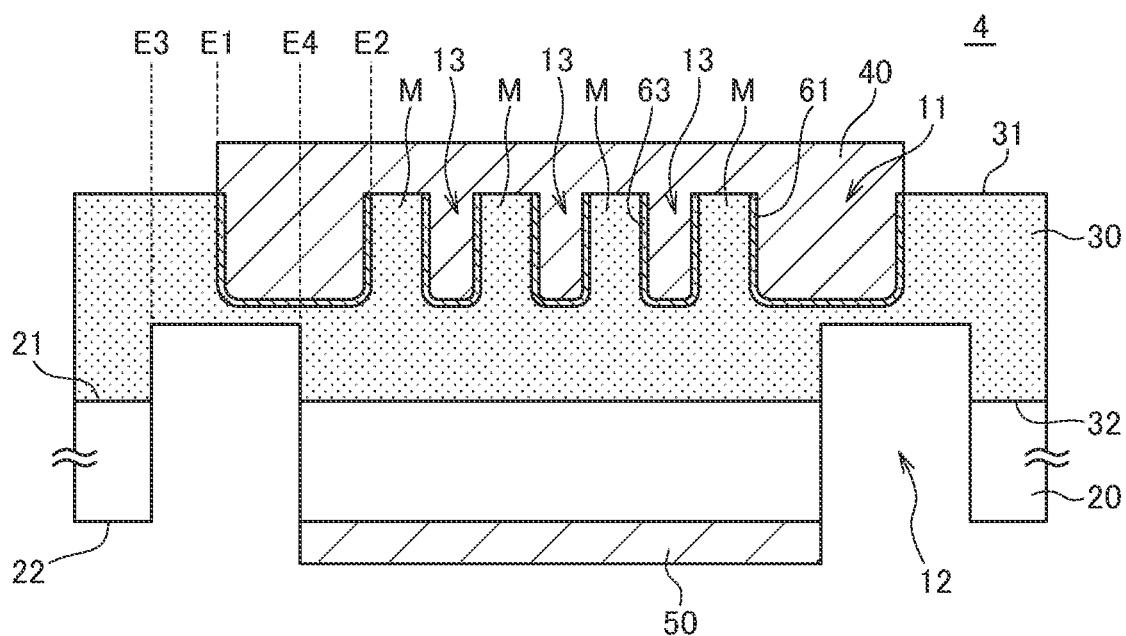
FIG. 13 is a schematic cross-sectional view illustrating the configuration of a Schottky barrier diode 4 according to a fourth embodiment of the present invention.

FIG. 13 is a schematic cross-sectional view illustrating the configuration of a Schottky barrier diode 4 according to a fourth embodiment of the present invention.

As illustrated in FIG. 13, the Schottky barrier diode 4 according to the fourth embodiment differs from the Schottky barrier diode 1 according to the first embodiment in that a plurality of center trenches 13 are formed in the upper surface 31 of the drift layer 30. Other basic configurations are the same as those of the Schottky barrier diode 1 according to the first embodiment, so the same reference numerals are given to the same elements, and overlapping description will be omitted.

The center trenches 13 are formed in the area surrounded by the outer peripheral trench 11 so as to overlap the anode electrode 40 in a plan view. The anode electrode 40 is filled in the center trenches 13 through an insulating film 63. In the present embodiment, the inner wall of each of the center trenches 13 is covered with the insulating film 63, and the inside of each of the center trenches 13 is filled with the same material as the anode electrode 40; however, the center trenches 13 may be filled with a reverse-conductivity type semiconductor material without through the insulating film 63. The center trenches 13 and outer peripheral trench 11 may not completely be separated from each other and may be formed continuously.

A part of the drift layer 30 that is defined by the trenches 11 and 13 constitutes a mesa region M. The mesa region M becomes a depletion layer when a backward voltage is applied between the anode electrode 40 and the cathode electrode 50, so that a channel region of the drift layer 30 is pinched off. Thus, a leak current upon application of the backward voltage can be significantly reduced.

Figure 14:
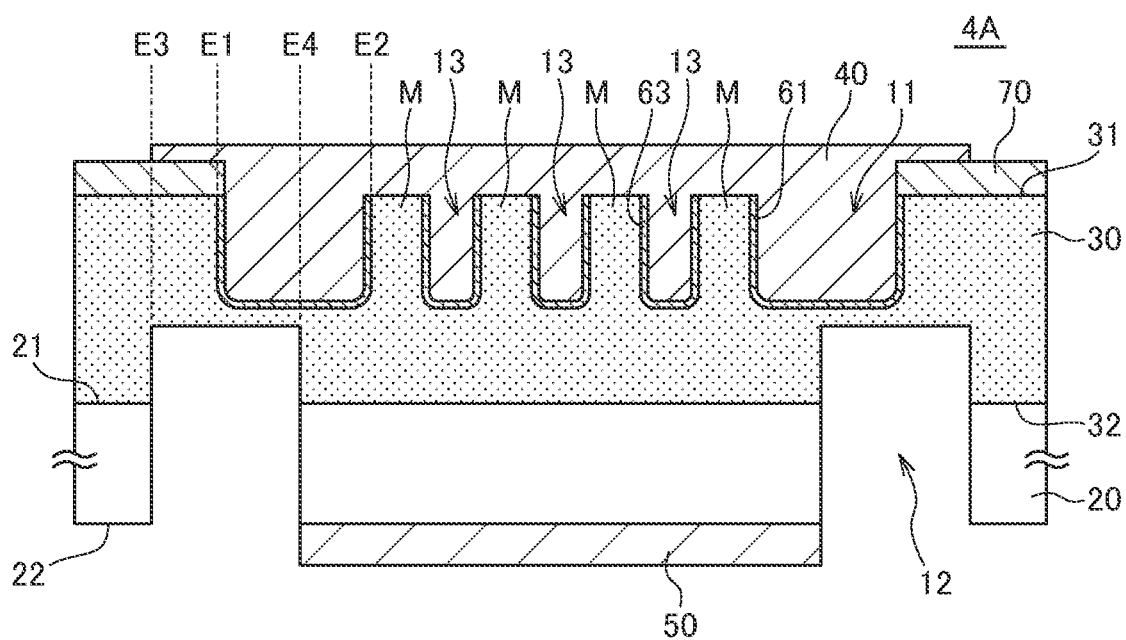
FIG. 14 is a schematic cross-sectional view illustrating the configuration of a Schottky barrier diode 4A according to a first modification of the fourth embodiment.

FIG. 14 is a schematic cross-sectional view illustrating the configuration of a Schottky barrier diode 4A according to a first modification of the fourth embodiment. The Schottky barrier diode 4A according to the modification differs from the Schottky barrier diode 4 according to the fourth embodiment in that the field insulating film 70 is provided as in the Schottky barrier diode 2 according to the second embodiment. As exemplified by this modification, the field insulating film 70 may be provided in a configuration where the plurality of center trenches 13 are formed.

Figure 15:
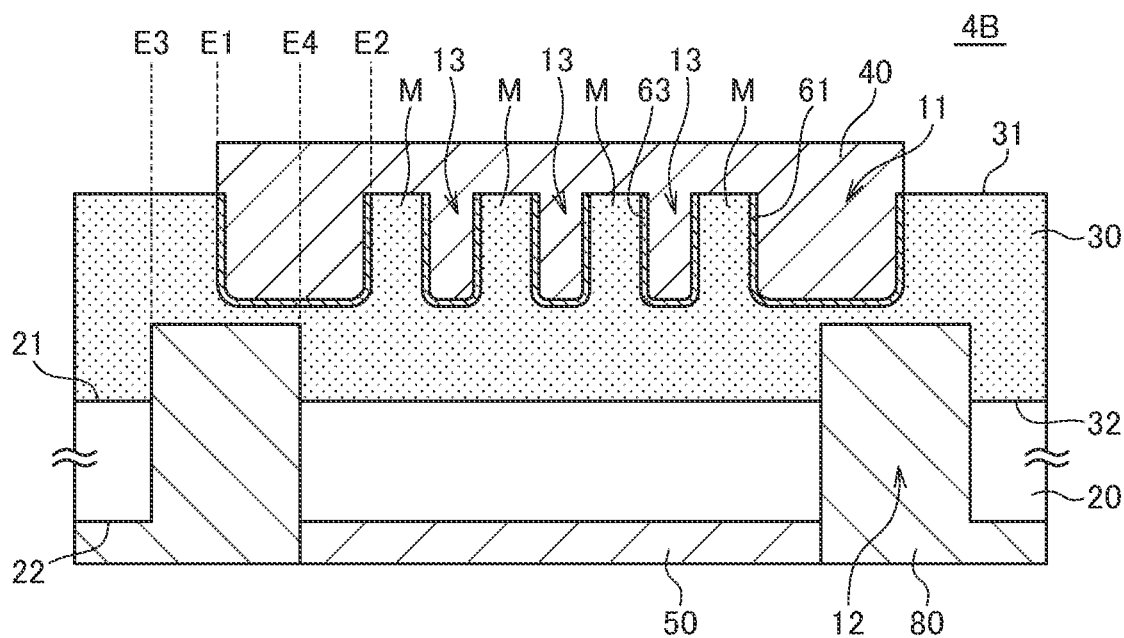
FIG. 15 is a schematic cross-sectional view illustrating the configuration of a Schottky barrier diode 4B according to a second modification of the fourth embodiment.

FIG. 15 is a schematic cross-sectional view illustrating the configuration of a Schottky barrier diode 4B according to a second modification of the fourth embodiment. The Schottky barrier diode 4B according to the modification differs from the Schottky barrier diode 4 according to the fourth embodiment in that the back surface trench 12 is filled with the insulating material 80 as in the Schottky barrier diode 3 according to the third embodiment. As exemplified by this modification, the back surface trench 12 may be filled with the insulating material 80 in a configuration where the plurality of center trenches 13 are formed.

Figure 16:
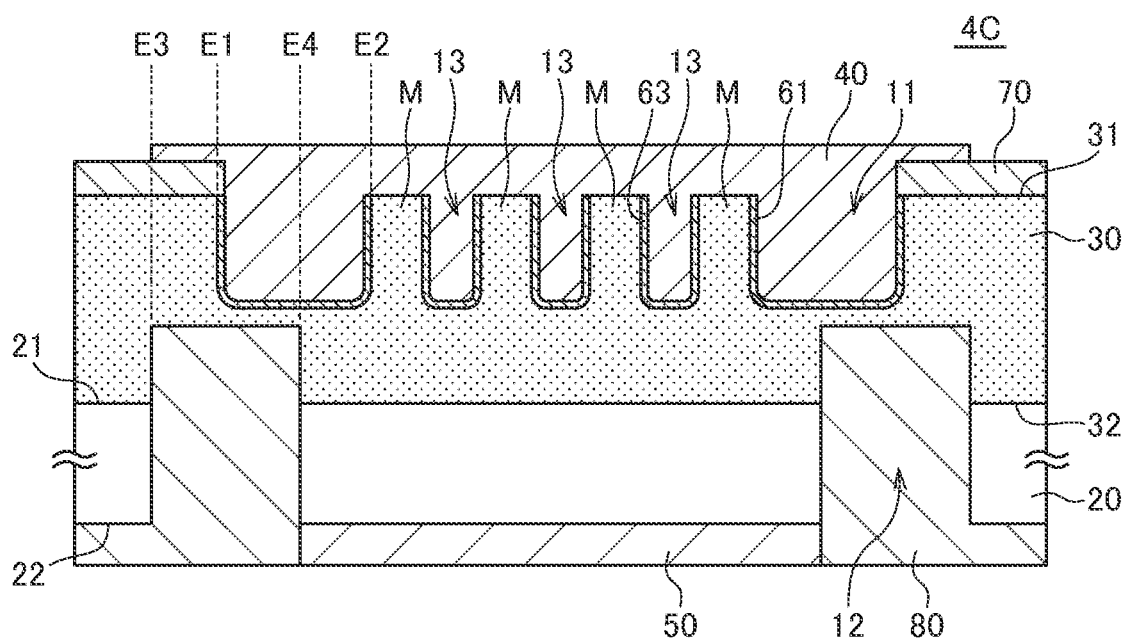
FIG. 16 is a schematic cross-sectional view illustrating the configuration of a Schottky barrier diode 4C according to a third modification of the fourth embodiment.

FIG. 16 is a schematic cross-sectional view illustrating the configuration of a Schottky barrier diode 4C according to a third modification of the fourth embodiment. In the Schottky barrier diode 4C according to the modification, the field insulating film 70 is provided in the configuration of the Schottky barrier diode 4B according to the second modification.

While the preferred embodiments of the present invention have been described, the present invention is not limited to the above embodiments, and various modifications may be made within the scope of the present invention, and all such modifications are included in the present invention.

EXAMPLES

Example 1

A simulation model of Example 1 having the same configuration as that of the Schottky barrier diode 1 illustrated in FIGS. 1 and 2 was assumed, and electric field strength was simulated with a backward voltage of 1000 V applied between the anode electrode 40 and the cathode electrode 50. The dopant concentration of the semiconductor substrate 20 was set to $1\times10^{18}$ cm$^{-3}$, and the dopant concentration of the drift layer 30 was to $1\times10^{16}$ cm$^{-3}$. The thickness of the drift layer 30 was set to 7 µm. Further, the width and depth of the outer peripheral trench 11 were set to 10 µm and 3 µm, respectively. The width of the back surface trench 12 was set to 10 µm, and the depth thereof was set to 2 µm from the lower surface 32 of the drift layer 30. The thickness of the insulating film 61 covering the inner wall of the outer peripheral trench 11 was set to 50 nm, and the material thereof was HfO$_2$. The anode electrode 40 was made of copper (Cu), and the material of the cathode electrode 50 was made of a laminated film of Ti/Au.

As a result, the maximum electric field applied to the drift layer 30 was 7.1 MV/cm, which sufficiently fell below the dielectric breakdown electric field strength (8 MV/cm) of gallium oxide.

Example 2

A simulation model of Example 2 having the same configuration as the Schottky barrier diode 4 illustrated in FIG. 13 was assumed, and electric field strength was simulated with a backward voltage of 800 V applied between the anode electrode 40 and the cathode electrode 50. The width and depth of the center trench 13 were set to 2 µm and 3 µm, respectively. The width of the drift layer 30 at a portion contacting the anode electrode 40, that is, the width of the mesa region M was set to 2 µm. The thickness of the insulating film 63 was set to 50 nm, and the material thereof was HfO$_2$. Other parameters were the same as those of the simulation model of Example 1.

As a result, the maximum electric field applied to the drift layer 30 was 6.6 MV/cm, which was lower than the maximum electric field in the simulation model of Example 1.

Example 3

Figures 17, 18:
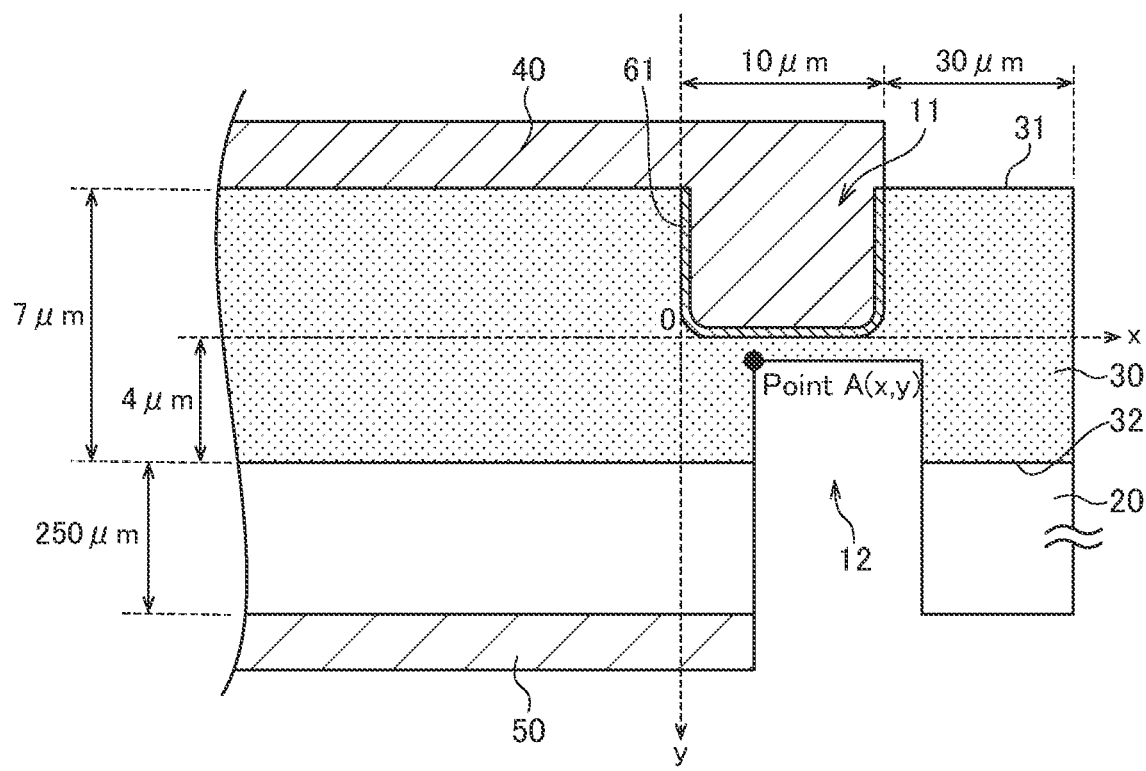
FIG. 17 is a schematic cross-sectional view illustrating a simulation model of the Example 3.
FIG. 18 is a table indicating a result of the Example 3.

A simulation model of Example 3 having the same configuration as the Schottky barrier diode 1 illustrated in FIGS. 1 and 2 was assumed. Then, with a horizontal virtual line extending along the bottom surface of the outer peripheral trench 11 set as the x-axis and a vertical virtual line extending along the inner peripheral wall E2 of the outer peripheral trench 11 set as the y-axis as illustrated in FIG. 17, the relation between coordinates A of the inner peripheral edge (point at which the inner peripheral wall E4 of the back surface trench 12 meets the bottom surface thereof) of the back surface trench 12 and the maximum electric field applied to the drift layer 30 was simulated. The width of the outer peripheral trench 11 was set to 10 µm, and the distance between the outer peripheral wall E1 of the outer peripheral trench 11 and the side wall of the drift layer 30 was set to 30 µm. Other parameters were the same as those of the simulation model of Example 1.

The results are shown in FIG. 18. The shading in the table of FIG. 18 indicates that the dielectric breakdown electric field strength reaches that (8 MV/cm) of gallium oxide. As illustrated in FIG. 18, the smaller the x-direction component of the coordinates A was, the smaller the maximum electric field applied to the drift layer 30 became, and the smaller the y-direction component of the coordinates A was, the smaller the maximum electric field applied to the drift layer 30 became. In particular, when the x-direction component was 10 µm, that is, when the outer peripheral wall E1 of the outer peripheral trench 11 and the inner peripheral wall E4 of the back surface trench 12 coincided with each other in a plan view, the y-direction component needed to be set to 2 µm or less, while when the x-direction component was 9.3 µm or less, the maximum electric field was suppressed to about 7.1 MV/cm even when the y-direction component was 3.5 µm.

REFERENCE SIGNS LIST 1-4, 1A-1G, 3A, 4A-4C Schottky barrier diode
11 outer peripheral trench
12 back surface trench
13 center trench
20 semiconductor substrate
21 upper surface of semiconductor substrate
22 lower surface of semiconductor substrate
30 drift layer
31 upper surface of drift layer
32 lower surface of drift layer
40 anode electrode
50 cathode electrode
61, 63 insulating film
70 field insulating film
80 insulating material
E1, E3 outer peripheral wall
E2, E4 inner peripheral wall
M mesa region

What is claimed is:

1. A Schottky barrier diode comprising:
a semiconductor substrate made of gallium oxide;
a drift layer made of gallium oxide, the drift layer having a lower surface contacting an upper surface of the semiconductor substrate and an upper surface positioned on a side opposite the lower surface, and the drift layer having a ring-shaped outer peripheral trench in the upper surface;
an anode electrode brought into Schottky contact with the upper surface of the drift layer surrounded by the outer peripheral trench and filled inside the outer peripheral trench through an insulating film; and
a cathode electrode brought into ohmic contact with a lower surface of the semiconductor substrate on a side opposite the upper surface thereof,
wherein a ring-shaped back surface trench is formed in the lower surface of the semiconductor substrate such that a bottom thereof reaches the drift layer,
wherein the cathode electrode is not present at a part of the lower surface of the semiconductor substrate that is outside an area surrounded by the back surface trench but is provided within the area surrounded by the back surface trench, and
wherein a part of the drift layer that is surrounded by the outer peripheral trench overlaps the area surrounded by the back surface trench in a plan view.

2. The Schottky barrier diode as claimed in claim 1, wherein an inner peripheral wall of the back surface trench is positioned inside an outer peripheral wall of the outer peripheral trench in a plan view.

3. The Schottky barrier diode as claimed in claim 2, wherein the inner peripheral wall of the back surface trench is positioned between inner and outer peripheral walls of the outer peripheral trench in a plan view.

4. The Schottky barrier diode as claimed in claim 1, further comprising a field insulating film that covers the upper surface of the drift layer in a ring shape so as to surround the outer peripheral trench,
wherein an outer peripheral end of the anode electrode is positioned on the field insulating film.

5. The Schottky barrier diode as claimed in claim 1, wherein the back surface trench is filled with an insulating material.

6. The Schottky barrier diode as claimed in claim 1,
wherein a plurality of center trenches are formed on the upper surface of the drift layer so as to be surrounded by the outer peripheral trench, and
wherein the anode electrode is filled in the center trenches through an insulating film.

* * * * *